United States Patent
Lim et al.

(10) Patent No.: US 9,576,652 B1
(45) Date of Patent: Feb. 21, 2017

(54) RESISTIVE RANDOM ACCESS MEMORY APPARATUS WITH FORWARD AND REVERSE READING MODES

(71) Applicant: Winbond Electronics Corp., Taichung (TW)

(72) Inventors: Seow-Fong Lim, Taichung (TW); Johnny Chan, Taichung (TW); Douk-Hyoun Ryu, Taichung (TW); Chi-Shun Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/992,025

(22) Filed: Jan. 11, 2016

(51) Int. Cl.
*G11C 13/00* (2006.01)
*H01L 23/528* (2006.01)
*H01L 27/24* (2006.01)

(52) U.S. Cl.
CPC ......... *G11C 13/004* (2013.01); *G11C 13/0026* (2013.01); *G11C 13/0028* (2013.01); *G11C 13/0069* (2013.01); *H01L 23/528* (2013.01); *H01L 27/2436* (2013.01); *G11C 2013/0057* (2013.01); *G11C 2213/79* (2013.01)

(58) Field of Classification Search
CPC ............... G11C 13/004; G11C 13/0028; G11C 13/0069; G11C 13/0026; G11C 2013/0057; G11C 2213/79; H01L 27/2436; H01L 23/528
See application file for complete search history.

(56) References Cited

U.S. PATENT DOCUMENTS

| 2003/0003674 | A1* | 1/2003 | Hsu | G11C 11/15 438/385 |
| 2010/0128516 | A1* | 5/2010 | Cho | G11C 7/12 365/163 |
| 2012/0250401 | A1* | 10/2012 | Storms | G11C 13/0004 365/163 |
| 2014/0219002 | A1* | 8/2014 | Lee | G11C 11/1675 365/148 |
| 2015/0055397 | A1* | 2/2015 | Yi | G11C 13/004 365/148 |

FOREIGN PATENT DOCUMENTS

WO 2012102734 8/2012

* cited by examiner

*Primary Examiner* — Khamdan Alrobaie
(74) *Attorney, Agent, or Firm* — Jianq Chyun IP Office

(57) ABSTRACT

The invention provides a resistive memory apparatus including at least one first resistive memory cell, a first bit line selecting switch, a first source line selecting switch, a first pull down switch and a second pull down switch. The first bit line selecting switch is coupled between a first bit line and a sense amplifier. The first source line selecting switch is coupled between a source line and the sense amplifier. The first and second pull down switches are respectively coupled to the bit line and source line. When a reading operation is operated, on or off statuses of the first bit line selecting switch and the second pull down switch are the same, on or off statuses of the first source line selecting switch and the first pull down switch are the same, and on or off statuses of the first and second pull down switches are complementary.

11 Claims, 4 Drawing Sheets

RESISTIVE RANDOM ACCESS MEMORY APPARATUS WITH FORWARD AND REVERSE READING MODES

BACKGROUND

Field of the Invention

The invention relates to a resistive memory apparatus. Particularly, the invention relates to the resistive memory apparatus with reversible sensing architecture.

Description of Related Art

In recently years, non-volatile memory apparatuses are getting important in electronic products. Correspondingly, a resistive random access memory (RRAM) apparatus is provided.

In convention art, it is a big challenge to select a good set or reset voltage and to overcome a read disturbance of RRAM cell. In conventional art, even a very small read voltage applied on the RRAM cell may change the cell state of the RRAM cell due to the read disturb condition. The RRAM cell is disturbed by the read voltage which is applied to the drain or source during the read operation which has the same voltage polarity of set or reset operation. Such as that, the RRAM cell has data disturb with continuous read.

SUMMARY OF THE INVENTION

The invention is directed to a resistive memory apparatus, which proves reversible sensing architecture to minimize bit cell read disturb condition of the resistive memory.

The invention provides a resistive memory apparatus. The resistive memory apparatus includes at least one first resistive memory cell, a first bit line selecting switch, a first source line selecting switch, a first pull down switch and a second pull down switch. The at least one first resistive memory cell has a first end, second end, and a control end, wherein the first end of the first resistive memory cell is coupled to a first bit line, a second end of the first resistive memory cell is coupled to a first source line, and the control end of the first resistive memory cell is coupled to a word line. The first bit line selecting switch has a first end being coupled to the first bit line, and a second end being coupled to a first input end of a sense amplifier. The first source line selecting switch has a first end being coupled to the first source line, and a second end being coupled to the first input end of the sense amplifier. The first pull down switch is coupled between the first end of the first resistive memory cell and a reference ground, and receives a first control signal for being turned on or off. The second pull down switch is coupled between the second end of the first resistive memory cell and the reference ground, and receives a second control signal for being turned on or off. Wherein, when a reading operation is operated on the first resistive memory cell, on or off statuses of the first bit line selecting switch and the second pull down switch are the same, on or off statuses of the first source line selecting switch and the first pull down switch are the same, and on or off statuses of the first and second pull down switches are complementary.

According to the above descriptions, in the present disclosure, the resistive memory cell can be read from both forward and reverse polarity of the resistive memory cell The read disturb condition can be minimize by the structure of the present disclosure. Further, the resistive memory cell of the present disclosure can be read in two different modes, and the forward read can be used in set verify operation, and the reverse read can be used in reset verify operation.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
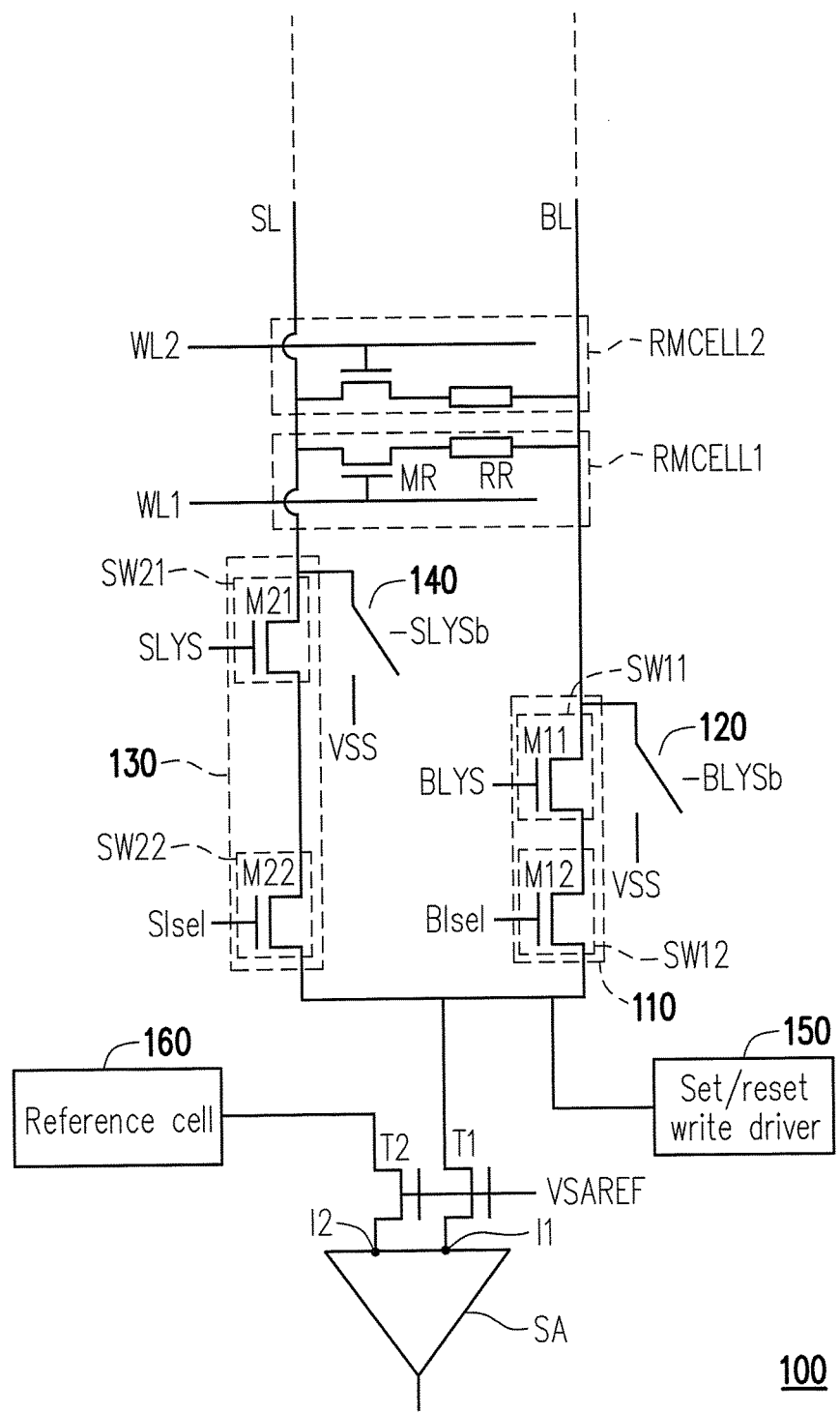
FIG. 1 illustrates a schematic diagram of a resistive memory apparatus according to an embodiment of present disclosure.

Referring to FIG. 1, FIG. 1 illustrates a schematic diagram of a resistive memory apparatus according to an embodiment of present disclosure. The resistive memory apparatus 100 includes resistive memory cells RMCELL1 and RMCELL2, a bit line selecting switch 110, a source line selecting switch 130, pull down switches 120 and 140, a set/reset write driver 150, a reference cell 160, and transistor T1s and T2. In this embodiment, a first end of the resistive memory cell RMCELL1 is coupled to a bit line BL, a second end of the resistive memory cell RMCELL1 is coupled to a source line SL, and a control end of the resistive memory cell RMCELL1 is coupled to a word line WL1. A first end of the resistive memory cell RMCELL2 is coupled to the bit line BL, a second end of the resistive memory cell RMCELL2 is coupled to the source line SL, and a control end of the resistive memory cell RMCELL2 is coupled to a word line WL2. In this embodiment, the resistive memory cell RMCELL1 is a 1T1R resistive memory cell. For example, the resistive memory cell RMCELL1 includes a transistor MR and a resistor RR, and the transistor MR and the resistor RR coupled in series between the source line SL and the bit line BL. A first end of the bit line selecting switch 110 is coupled to the bit line BL, and a second end of the bit line selecting switch 110 is coupled to a first input end I1 of a sense amplifier SA. A first end of the source line selecting switch 130 is coupled to the source line SL, and a second end of the source line selecting switch 130 is also coupled to the first input end I1 of the sense amplifier SA. The pull down switches 120 and 140 are respectively coupled to the bit line BL and the source line SL, the pull down switches 120 and 140 are respectively controlled by control signals BLYSb and BLSY to be turned on or turned off for respectively pulling the bit line BL and source line SL to a reference ground VSS.

On the other hand, the set/reset write driver 150 is coupled to the first input end I1 of the sense amplifier SA, and the set/reset write driver 150 may provide a writing signal to the bit line BL through the bit line selecting switch 110 for setting or resetting the resistive memory cell RMCELL1 or RMCELL2. The reference cell 160 is coupled to a send input end I2 of the sense amplifier SA. The reference cell 160 has a predetermined reference resistance and provides a reference signal to the second input end I2 of the sense amplifier SA according to the reference resistance.

The transistor T2 is coupled between the reference 160 and the second input end I2 of the sense amplifier SA, and the transistor T1 is coupled between the second end of the bit line selecting switch 110 and the first input end I1 of the sense amplifier SA. The control ends of the transistors T1 and T2 receive a reference bias voltage VSAREF.

In present embodiment, the bit line selecting switch 110 includes switches SW11 and SW12. The switches SW11 and SW12 are coupled in series between the bit line BL and the first input end I1 of the sense amplifier SA. A control end of the switch SW11 receives an inverted control signal BLYS, and the switch SW11 is turned on or off according to the inverted control signal BLYS. A control signal of the switch SW12 receives a bit line selecting signal B1sel, and the switch SW12 is turned on or off according to the bit line selecting signal B1sel. Wherein, the inverted control signal BLYS is inverted to the control signal BLYSb. Additional, the switches SW11 and SW12 are respectively formed by a transistor M11 and transistor M12.

The source line selecting switch 130 includes switches SW21 and SW22. The switches SW21 and SW22 are coupled in series between the source line SL and the first input end I1 of the sense amplifier SA. A control end of the switch SW21 receives an inverted control signal SLYS, and the switch SW21 is turned on or off according to the inverted control signal SLYS. A control signal of the switch SW22 receives a source line selecting signal S1sel, and the switch SW12 is turned on or off according to the source line selecting signal S1sel. Wherein, the inverted control signal SLYS is inverted to the control signal SLYSb. Additional, the switches SW21 and SW22 are respectively formed by a transistor M21 and transistor M22.

When a reading operation is operated on the resistive memory cell RMCELL1, on or off statuses of the bit line selecting switch 110 and the pull down switch 140 are the same, on or off statuses of the source line selecting switch 130 and the pull down switch 120 are the same, and on or off statuses of the pull down switches 120 and 140 are complementary.

About detail operation of the resistive memory apparatus 100, when a reading operation is operated on the resistive memory apparatus 100, there are two modes may be selected for the reading operation. A first mode is a forward reading mode and another mode, second mode, is a reverse reading mode. If the forward reading mode is selected, both of the switches SW21 and SW22 of the source line selecting switch 130 are turned off, and the pull down switch 140 is turned on. Furthermore, both of the switches SW11 and SW12 of the bit line selecting switch 110 are turned on, and the pull down switch 120 is turned off. If the resistive memory cell RMCELL1 is selected for the reading operation, and the resistive memory cell RMCELL2 is unselected, the word line WL2 may be pulled to a ground voltage, and the word line WL1 may be driven to an enable voltage. Such as that, during the reading operation, the pull down switch 140, the resistive memory cell RMCELL1 and the bit line selecting switch 110 may form an electric loop, and a resistance of the resistive memory cell RMCELL1 can be represented in a current or voltage format to be transported to the first input end I1 of the sense amplifier SA. Then, the sense amplifier SA may compare the signal on the first and second ends I1 and I2 to generate a sensing output data.

On the contrary, if the reverse reading mode is selected, both of the switches SW21 and SW22 of the source line selecting switch 130 are turned on, and the pull down switch 140 is turned off. Furthermore, both of the switches SW11 and SW12 of the bit line selecting switch 110 are turned off, and the pull down switch 120 is turned on. If the resistive memory cell RMCELL1 is selected for the reading operation, such as that, the pull down switch 120, the resistive memory cell RMCELL1 and the source line selecting switch 130 may form an electric loop, and a resistance of the resistive memory cell RMCELL1 can be represented in a current or voltage format to be transported to the first input end I1 of the sense amplifier SA. Then, the sense amplifier SA may compare the signal on the first and second ends I1 and I2 to generate the sensing output data.

It should be noted here, the forward reading mode is defined as the reading operation has a reading voltage polarity the same as a setting voltage polarity, and the reverse reading mode is defined as the reading operation has the reading voltage polarity the same as a resetting voltage polarity. In some embodiments, the forward reading mode may be operated after a setting operation for a set-verify operation, and the reverse reading mode may be operated after a resetting operation for a reset-verify operation.

On the other hands, the resistive memory apparatus 100 may read the resistive memory cell from either forward or reverse reading mode, and a pre-determined reading mode may be selected by a fuse option bit. For example, by the fuse option bit, the reverse reading mode can be applied for all of the verify reading operations and normal reading operations because of the reverse reading mode has higher disturb read voltage (about 0.6V).

In additional, the reference cell 160 has the same forward or reverse read voltage polarity as the resistive memory cell RMCELL1 for good circuit matching.

Figure 2:
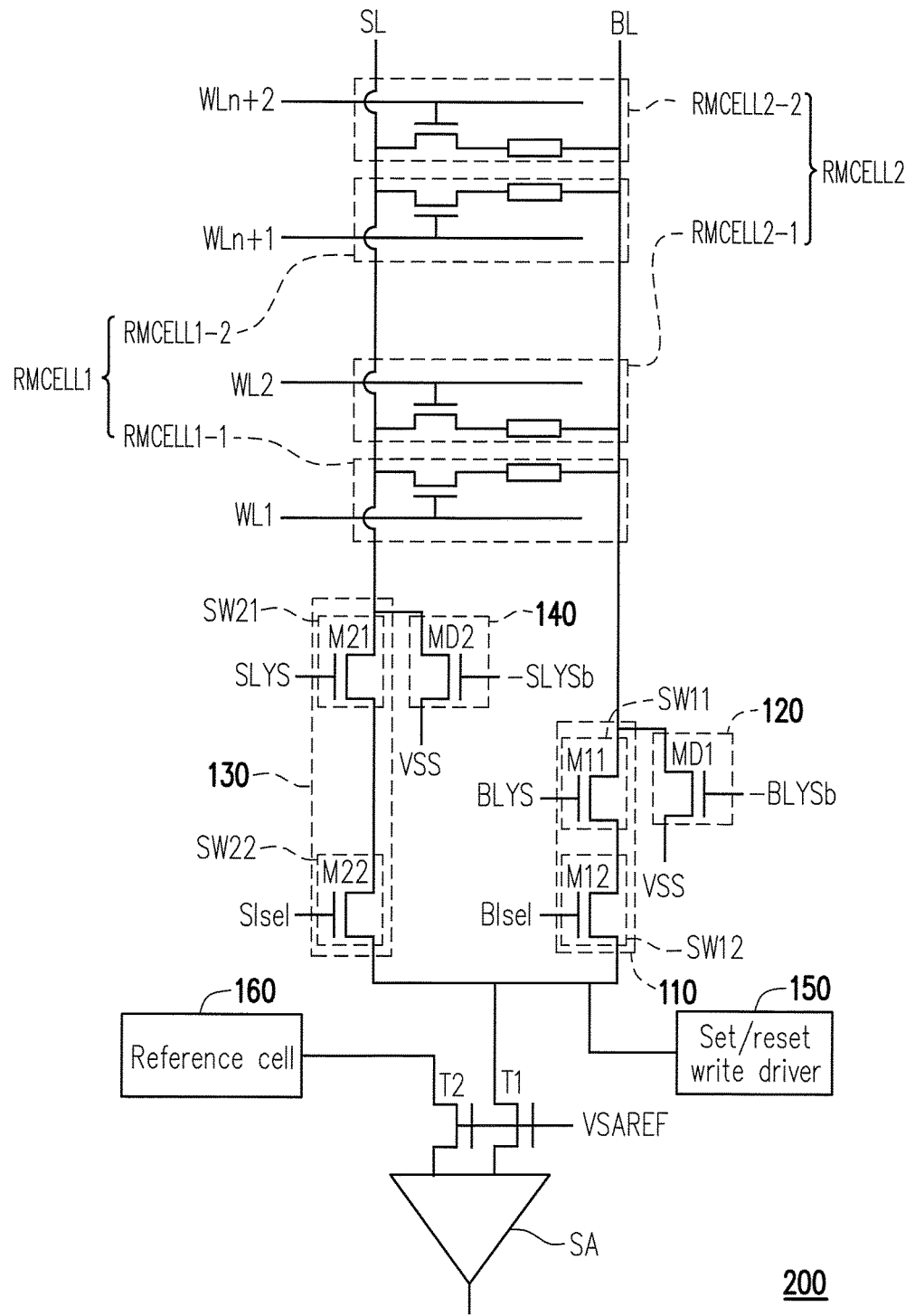
FIG. 2 illustrate a schematic diagram of a resistive memory apparatus according to another embodiment of present disclosure.

Referring to FIG. 2, FIG. 2 illustrate a schematic diagram of a resistive memory apparatus according to another embodiment of present disclosure. The resistive memory apparatus 200 includes resistive memory cells RMCELL1 and RMCELL2, a bit line selecting switch 110, a source line selecting switch 130, pull down switches 120 and 140, a set/reset write driver 150, a reference cell 160, and transistor T1s and T2. In this embodiment, the resistive memory cells RMCELL1 includes a memory cell RMCELL1-1 and RMCELL1-2, and the resistive memory cells RMCELL2 includes a memory cell RMCELL2-1 and RMCELL2-2. The memory cells RMCELL1-1, RMCELL1-2, RMCELL2-1 and RMCELL2-2 are coupled to the same source line SL, and coupled to the same bit line BL. But, the memory cells RMCELL1-1 and RMCELL1-2 are respectively coupled to two different word lines WL1 and WLn+1, and the memory cells RMCELL2-1 and RMCELL2-2 are respectively coupled to two different word lines WL2 and WLn+2.

In this embodiment, the pull down switches 120 and 140 are respectively formed by the transistors MD1 and MD2.

Figure 3:
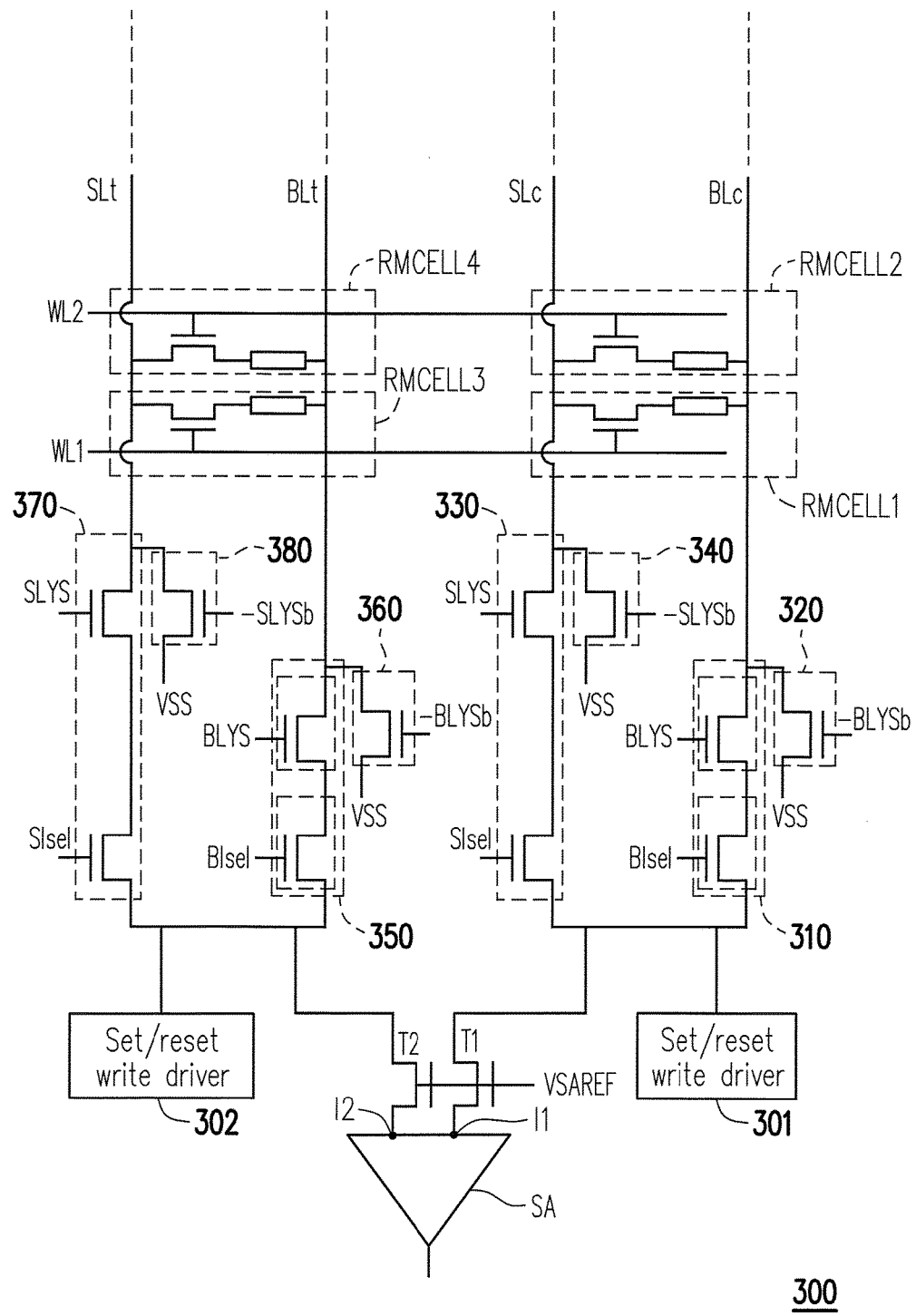
FIG. 3 illustrate a schematic diagram of a resistive memory apparatus according to another embodiment of present disclosure.

Referring to FIG. 3, FIG. 3 illustrate a schematic diagram of a resistive memory apparatus according to another embodiment of present disclosure. The resistive memory apparatus 300 includes resistive memory cells RMCELL1-RMCELL4, bit line selecting switches 310 and 350, source line selecting switches 330 and 370, pull down switches 320, 340, 360 and 380, set/reset write drivers 301 and 302, and transistors T1 and T2. The bit line selecting switch 310 is coupled between the bit line BLc and the first input end I1 of the sense amplifier SA, and the pull down switch 320 is coupled between the bit line BLc and the reference ground VSS. The source line selecting switch 330 is coupled between the source line SLc and the first input end I1 of the sense amplifier SA, and the pull down switch 340 is coupled between the source line SLc and the reference ground VSS.

The bit line selecting switch 350 is coupled between the bit line BLt and the second input end I2 of the sense amplifier SA, and the pull down switch 360 is coupled between the bit line BLt and the reference ground VSS. The source line selecting switch 380 is coupled between the source line SLt and the second input end I2 of the sense amplifier SA, and the pull down switch 380 is coupled between the source line SLt and the reference ground VSS.

The set/reset write drivers 301 and 302 are respectively coupled to the first and second input end I1 and I2 of the sense amplifier SA.

In the forward reading mode, the resistive memory cells RMCELL1 and RMCELL3 are selected for reading. The bit line selecting switches 310 and 350 are turned on, the pull down switches 340 and 380 are turned on, the source line selecting switches 330 and 370 are turned off, and the pull down switches 320 and 360 are turned off. The sense amplifier SA sense signals from the bit lines BLt and BLc, and generates the sensing output data by comparing the signals from the bit lines BLt and BLc.

In the reverse reading mode, the resistive memory cells RMCELL1 and RMCELL3 are selected for reading. The bit line selecting switches 310 and 350 are turned off, the pull down switches 340 and 380 are turned off, the source line selecting switches 330 and 370 are turned on, and the pull down switches 320 and 360 are turned on. The sense amplifier SA sense signals from the source lines SLt and SLc, and generates the sensing output data by comparing the signals from the source lines SLt and SLc.

Figure 4:
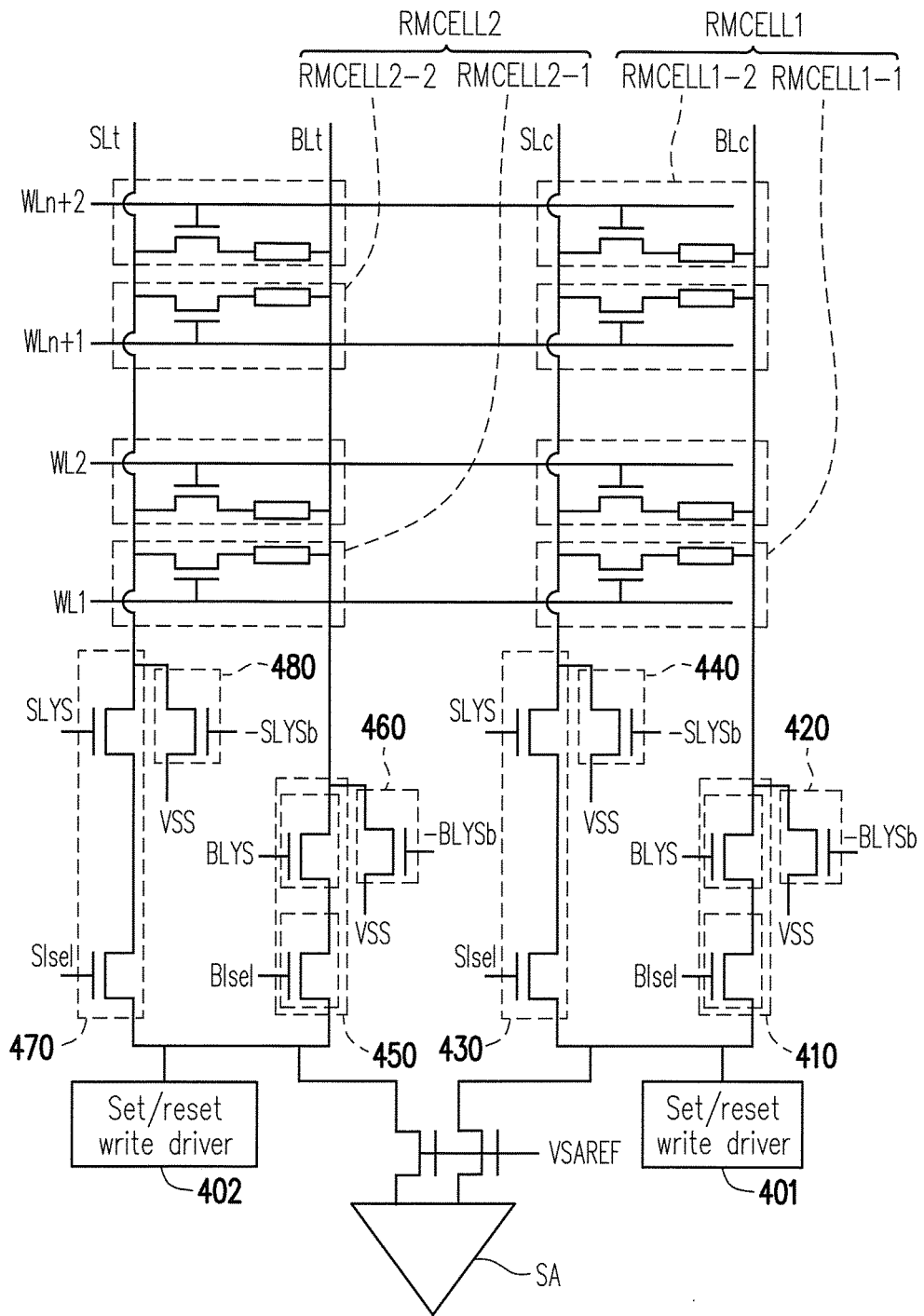
FIG. 4 illustrate a schematic diagram of a resistive memory apparatus according to another embodiment of present disclosure.

Referring to FIG. 4, FIG. 4 illustrate a schematic diagram of a resistive memory apparatus according to another embodiment of present disclosure. The resistive memory apparatus 400 includes resistive memory cells RMCELL1-RMCELL2, bit line selecting switches 410 and 450, source line selecting switches 430 and 470, pull down switches 420, 440, 460 and 480, set/reset write drivers 401 and 402, and transistors T1 and T2. In this embodiment, the resistive memory cell RMCELL1 includes memory cells RMCELL1-1 and RMCELL1-2, and the resistive memory cell RMCELL2 includes memory cells RMCELL2-1 and RMCELL2-2.

The memory cells RMCELL1-1 and RMCELL1-2 are coupled to the same bit line BLc and coupled to the same source line BLc, but the memory cells RMCELL1-1 and RMCELL1-2 are respectively coupled to different word lines WL1 and WLn+1. The memory cells RMCELL2-1 and RMCELL2-2 are coupled to the same bit line BLt and coupled to the same source line BLt, but the memory cells RMCELL2-1 and RMCELL2-2 are respectively coupled to different word lines WL1 and WLn+1. In this embodiment, the sensing current obtained by the sense amplifier SA may be enlarged, and a data reading accuracy of the resistive memory apparatus 400 can be improved.

In summary, the present disclosure provides a reversible sensing memory architecture, and one of the forward and reverse reading operations can be selected and the read disturb condition can be minimized.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A resistive memory apparatus, comprising:
    at least one first resistive memory cell, having a first end, second end, and a control end, wherein the first end of the first resistive memory cell is coupled to a first bit line, a second end of the first resistive memory cell is coupled to a first source line, and the control end of the first resistive memory cell is coupled to a word line;
    a first bit line selecting switch, having a first end being coupled to the first bit line, a second end being coupled to a first input end of a sense amplifier, and providing the first bit line to be connected to the first input end of the sense amplifier during a first mode of a reading operation;
    a first source line selecting switch, having a first end being coupled to the first source line, a second end being coupled to the first input end of the sense amplifier, and providing the first source line to be connected to the first input end of the sense amplifier during a second mode of the reading operation;
    a first pull down switch, coupled between the first end of the first resistive memory cell and a reference ground, receiving a first control signal for being turned on or off; and
    a second pull down switch, coupled between the second end of the first resistive memory cell and the reference ground, receiving a second control signal for being turned on or off,
    wherein, when the reading operation is operated on the first resistive memory cell, on or off statuses of the first bit line selecting switch and the second pull down switch are the same, on or off statuses of the first source line selecting switch and the first pull down switch are the same, and on or off statuses of the first and second pull down switches are complementary.

2. The resistive memory apparatus as claimed in claim 1, wherein the first bit line selecting switch comprises:
    a first switch unit, having a first end, a second end, and a control end, wherein the first end of the first switch unit is coupled to the first bit line, and the control end of the first switch unit receives an inverted first control signal; and
    a second switch unit, having a first end, a second end, and a control end, wherein the first end of the second switch unit is coupled to the second end of the first switch unit, the second end of the second switch is coupled to the first input end of the sense amplifier, and the control end of the first switch unit receives a first bit line selecting signal.

3. The resistive memory apparatus as claimed in claim 1, wherein the first source line selecting switch comprises:
    a first switch unit, having a first end, a second end, and a control end, wherein the first end of the first switch unit is coupled to the first source line, and the control end of the first switch unit receives an inverted second control signal; and
    a second switch unit, having a first end, a second end, and a control end, wherein the first end of the second switch unit is coupled to the second end of the first switch unit, the second end of the second switch is coupled to the first input end of the sense amplifier, and the control end of the first switch unit receives a first source line selecting signal.

4. The resistive memory apparatus as claimed in claim 1, further comprising:
   a reference cell, coupled to a second input end of the sense amplifier, wherein the reference cell has a reference resistance and providing a reference signal to the second input end of the sense amplifier according to the reference resistance.

5. The resistive memory apparatus as claimed in claim 4, further comprising:
   a first transistor, having a first end being coupled to the second ends of the first bit line selecting switch and the first source line selecting switch, a second end being coupled to the first input end of the sense amplifier, and a control end receiving a reference bias voltage; and
   a second transistor, having a first end receiving the reference signal, a second end being coupled to the second input end of the sense amplifier, and a control end receiving the reference bias voltage.

6. The resistive memory apparatus as claimed in claim 1, further comprising:
   a set/reset write driver, coupled to the first bit line selecting switch, providing a writing signal to the first bit line through the first bit line selecting switch for set or reset the first resistive memory cell.

7. The resistive memory apparatus as claimed in claim 1, further comprising:
   at least one second resistive memory cell, having a first end, second end, and a control end, wherein the first end of the first resistive memory cell is coupled to a second bit line, a second end of the first resistive memory cell is coupled to a second source line, and the control end of the first resistive memory cell is coupled to the word line;
   a second bit line selecting switch, having a first end being coupled to the second bit line, and a second end being coupled to a second input end of the sense amplifier;
   a second source line selecting switch, having a first end being coupled to the second source line, and a second end being coupled to the second input end of the sense amplifier;
   a third pull down switch, coupled between the first end of the second resistive memory cell and the reference ground, receiving the first control signal for being turned on or off; and
   a fourth pull down switch, coupled between the second end of the second resistive memory cell and the reference ground, receiving the second control signal for being turned on or off,
   wherein, when the reading operation is operated on the second resistive memory cell, on or off statuses of the second bit line selecting switch and the fourth pull down switch are the same, on or off statuses of the second source line selecting switch and the third pull down switch are the same, and on or off statuses of the third and fourth pull down switches are complementary.

8. The resistive memory apparatus as claimed in claim 7, wherein the second bit line selecting switch comprises:
   a first switch unit, having a first end, a second end, and a control end, wherein the first end of the first switch unit is coupled to the second bit line, and the control end of the first switch unit receives an inverted first control signal; and
   a second switch unit, having a first end, a second end, and a control end, wherein the first end of the second switch unit is coupled to the second end of the first switch unit, the second end of the second switch is coupled to the second input end of the sense amplifier, and the control end of the first switch unit receives a first bit line selecting signal.

9. The resistive memory apparatus as claimed in claim 7, wherein the second source line selecting switch comprises:
   a first switch unit, having a first end, a second end, and a control end, wherein the first end of the first switch unit is coupled to the second source line, and the control end of the first switch unit receives an inverted second control signal; and
   a second switch unit, having a first end, a second end, and a control end, wherein the first end of the second switch unit is coupled to the second end of the first switch unit, the second end of the second switch is coupled to the second input end of the sense amplifier, and the control end of the first switch unit receives a first source line selecting signal.

10. The resistive memory apparatus as claimed in claim 9, further comprising:
   a first transistor, having a first end being coupled to the second ends of the first bit line selecting switch and the first source line selecting switch, a second end being coupled to the first input end of the sense amplifier, and a control end receiving a reference bias voltage; and
   a second transistor, having a first end being coupled to second bit line selecting switch and the second source line selecting switch, a second end being coupled to the second input end of the sense amplifier, and a control end receiving the reference bias voltage.

11. The resistive memory apparatus as claimed in claim 7, further comprising:
   a set/reset write driver, coupled to the second source line selecting switch, providing a writing signal to the second source line through the second source line selecting switch for set or reset the second resistive memory cell.

* * * * *